United States Patent
Abe

(10) Patent No.: US 12,027,646 B2
(45) Date of Patent: Jul. 2, 2024

(54) LIGHT EMITTING ELEMENT

(71) Applicant: NICHIA CORPORATION, Anan (JP)

(72) Inventor: Makoto Abe, Tokushima (JP)

(73) Assignee: NICHIA CORPORATION, Anan (JP)

(*) Notice: Subject to any disclaimer, the term of this patent is extended or adjusted under 35 U.S.C. 154(b) by 108 days.

(21) Appl. No.: 17/365,820

(22) Filed: Jul. 1, 2021

(65) Prior Publication Data

US 2021/0328105 A1    Oct. 21, 2021

Related U.S. Application Data

(62) Division of application No. 16/660,104, filed on Oct. 22, 2019, now abandoned.

(30) Foreign Application Priority Data

Oct. 25, 2018  (JP) .................................. 2018-200721

(51) Int. Cl.
- *H01L 33/32* (2010.01)
- *H01L 33/00* (2010.01)
- *H01L 33/06* (2010.01)

(52) U.S. Cl.
CPC .......... *H01L 33/32* (2013.01); *H01L 33/0008* (2013.01); *H01L 33/06* (2013.01)

(58) Field of Classification Search
CPC ...... H01L 33/32; H01L 33/0008; H01L 33/06
See application file for complete search history.

(56) References Cited

U.S. PATENT DOCUMENTS

| | | | |
|---|---|---|---|
| 10,319,879 B2 | 6/2019 | Lin et al. | |
| 2006/0049415 A1 | 3/2006 | Liao et al. | |
| 2007/0241353 A1* | 10/2007 | Taki | H01L 33/32 |
| | | | 257/94 |
| 2007/0290230 A1 | 12/2007 | Kawaguchi et al. | |
| 2008/0099755 A1 | 5/2008 | Tansu et al. | |

(Continued)

FOREIGN PATENT DOCUMENTS

| | | |
|---|---|---|
| EP | 1 145 331 B1 | 10/2001 |
| JP | 2010-021290 A | 1/2010 |

(Continued)

OTHER PUBLICATIONS

U.S. Office Action on U.S. Appl. No. 16/660,104 DTD Nov. 30, 2020.

(Continued)

*Primary Examiner* — Bitew A Dinke
(74) *Attorney, Agent, or Firm* — Foley & Lardner LLP

(57) ABSTRACT

A light emitting element includes: an n-side semiconductor layer made of a nitride semiconductor; a p-side semiconductor layer made of a nitride semiconductor; and an active layer disposed between the n-side semiconductor and the p-side semiconductor layer and having a multi-quantum well structure in which a plurality of nitride semiconductor well layers and a plurality of nitride semiconductor barrier layers are alternately stacked, wherein the light emitting element includes, between at least one of the plurality of well layers and the barrier layer disposed adjacent thereto on the p-side semiconductor side: a first layer and a second layer disposed successively from the well layer side.

18 Claims, 9 Drawing Sheets

(56) References Cited

U.S. PATENT DOCUMENTS

| | | | |
|---|---|---|---|
| 2009/0200565 A1* | 8/2009 | Sakong | H01L 33/34 257/E33.025 |
| 2010/0009484 A1 | 1/2010 | Akita et al. | |
| 2010/0117055 A1 | 5/2010 | Nakanishi et al. | |
| 2010/0133506 A1 | 6/2010 | Nakanishi et al. | |
| 2010/0176372 A1 | 7/2010 | Yoo et al. | |
| 2010/0187497 A1 | 7/2010 | Nago et al. | |
| 2011/0104843 A1* | 5/2011 | Jun | H01L 33/0075 438/45 |
| 2011/0121265 A1* | 5/2011 | Ueno | H01S 5/320275 257/14 |
| 2011/0133156 A1* | 6/2011 | Won | H01L 33/325 257/13 |
| 2011/0187294 A1 | 8/2011 | Bergmann et al. | |
| 2011/0227039 A1* | 9/2011 | Moon | H01L 33/06 257/13 |
| 2011/0303896 A1* | 12/2011 | Brandes | H01L 25/0753 257/13 |
| 2012/0261687 A1* | 10/2012 | Shim | H01L 33/04 257/97 |
| 2013/0001512 A1* | 1/2013 | Kotani | H01L 33/06 257/13 |
| 2013/0087806 A1* | 4/2013 | Ito | H01L 33/405 257/E33.072 |
| 2013/0146840 A1 | 6/2013 | Han et al. | |
| 2013/0193443 A1* | 8/2013 | Ito | H01L 33/0095 438/29 |
| 2013/0228747 A1 | 9/2013 | Han et al. | |
| 2013/0334493 A1 | 12/2013 | Luo | |
| 2014/0042388 A1* | 2/2014 | Hwang | H01L 33/32 257/13 |
| 2014/0048771 A1* | 2/2014 | Takahashi | H01L 21/02576 257/13 |
| 2014/0209921 A1* | 7/2014 | Kusunoki | H01L 33/007 438/47 |
| 2015/0101657 A1* | 4/2015 | Barik | H01L 31/035236 438/94 |
| 2016/0190393 A1* | 6/2016 | Ito | H01L 33/405 257/98 |
| 2016/0225950 A1* | 8/2016 | Han | H01L 33/06 |
| 2016/0343900 A1* | 11/2016 | Obuchi | H01L 33/32 |
| 2017/0025568 A1 | 1/2017 | Ji et al. | |
| 2017/0062660 A1 | 3/2017 | Furuyama | |
| 2017/0229609 A1* | 8/2017 | Michiue | H01L 33/06 |
| 2018/0287014 A1 | 10/2018 | Asada et al. | |
| 2019/0035977 A1 | 1/2019 | Bhusal et al. | |

FOREIGN PATENT DOCUMENTS

| | | |
|---|---|---|
| JP | 2014-003121 A | 1/2014 |
| JP | 2016-127064 A | 7/2016 |
| JP | 2016-225384 A | 12/2016 |
| JP | 2017-045798 A | 3/2017 |
| KR | 20090003384 A | 1/2009 |
| KR | 20130011918 A | 1/2013 |
| WO | WO-2008/155958 A1 | 12/2008 |
| WO | WO-2010/024436 A1 | 3/2010 |

OTHER PUBLICATIONS

U.S. Office Action on U.S. Appl. No. 16/660,104 DTD Apr. 2, 2021.

* cited by examiner

LIGHT EMITTING ELEMENT

CROSS-REFERENCE TO RELATED APPLICATIONS

This application is a divisional of U.S. patent application Ser. No. 16/660,104, filed Oct. 22, 2019, which is based upon and claims priority to Japanese Patent Application No. 2018-200721, filed on Oct. 25, 2018, the entire contents of which are incorporated herein by reference in their entireties.

BACKGROUND

The present invention relates to a light emitting element. Semiconductor light emitting elements such as light emitting diodes are utilized in various applications. Depending on the application, more stringent brightness requirements are being requested for a light emitting element. Although raising the drive current is the simplest way to increase the brightness, driving a light emitting element at higher currents can induce a phenomenon known as efficiency droop, which in turn reduces the emission efficiency.

Japanese Patent Publication No. 2017-045798 discloses a background technology that can reduce the droop phenomenon. This patent publication discloses a technique to improve the semiconductor layer structure of a semiconductor light emitting element to thereby increase the emission efficiency of the light emitting element.

SUMMARY

In recent years, however, there has been a need for a light emitting element having even higher emission efficiency when driven at higher currents. One object of the present invention is to provide a light emitting element that demonstrates high emission efficiency when driven at higher currents.

According to one embodiment, a light emitting element includes an n-side semiconductor layer made of a nitride semiconductor, a p-side semiconductor layer made of a nitride semiconductor, and an active layer disposed between the n-side semiconductor layer and the p-side semiconductor layer and having a multi-quantum well structure alternately stacking a plurality of nitride semiconductor well layers and a plurality of nitride semiconductor barrier layers, wherein the light emitting element has, between any one of the plurality of well layers and the barrier layer disposed adjacent thereto on the p-side semiconductor layer side, a first layer having a larger band gap and a lower thickness than that of any well layer, and a second layer having a smaller band gap than the first layer and any barrier layer and a lower thickness than any well layer, which are disposed successively from the well layer.

The light emitting element according to the embodiment of the present invention can increase the emission efficiency when driven at higher currents.

DETAILED DESCRIPTION

Certain embodiments of the present invention will be explained below based on the drawings.

First Embodiment

Figure 1:
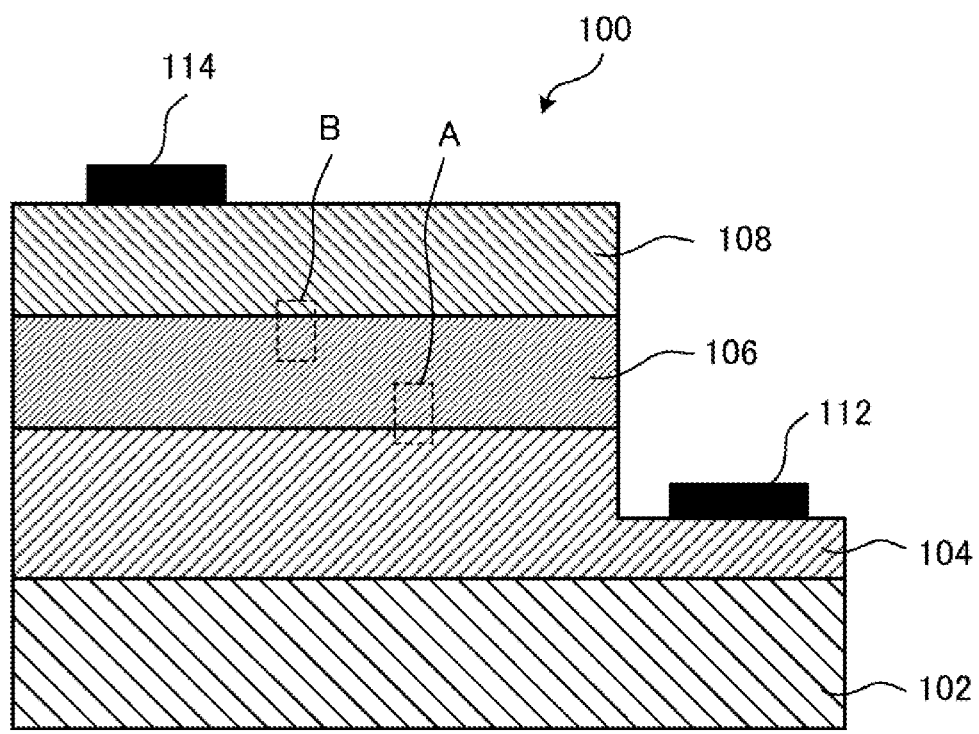
FIG. 1 is a schematic cross-sectional view of a light emitting element according to one embodiment.
Figure 2:
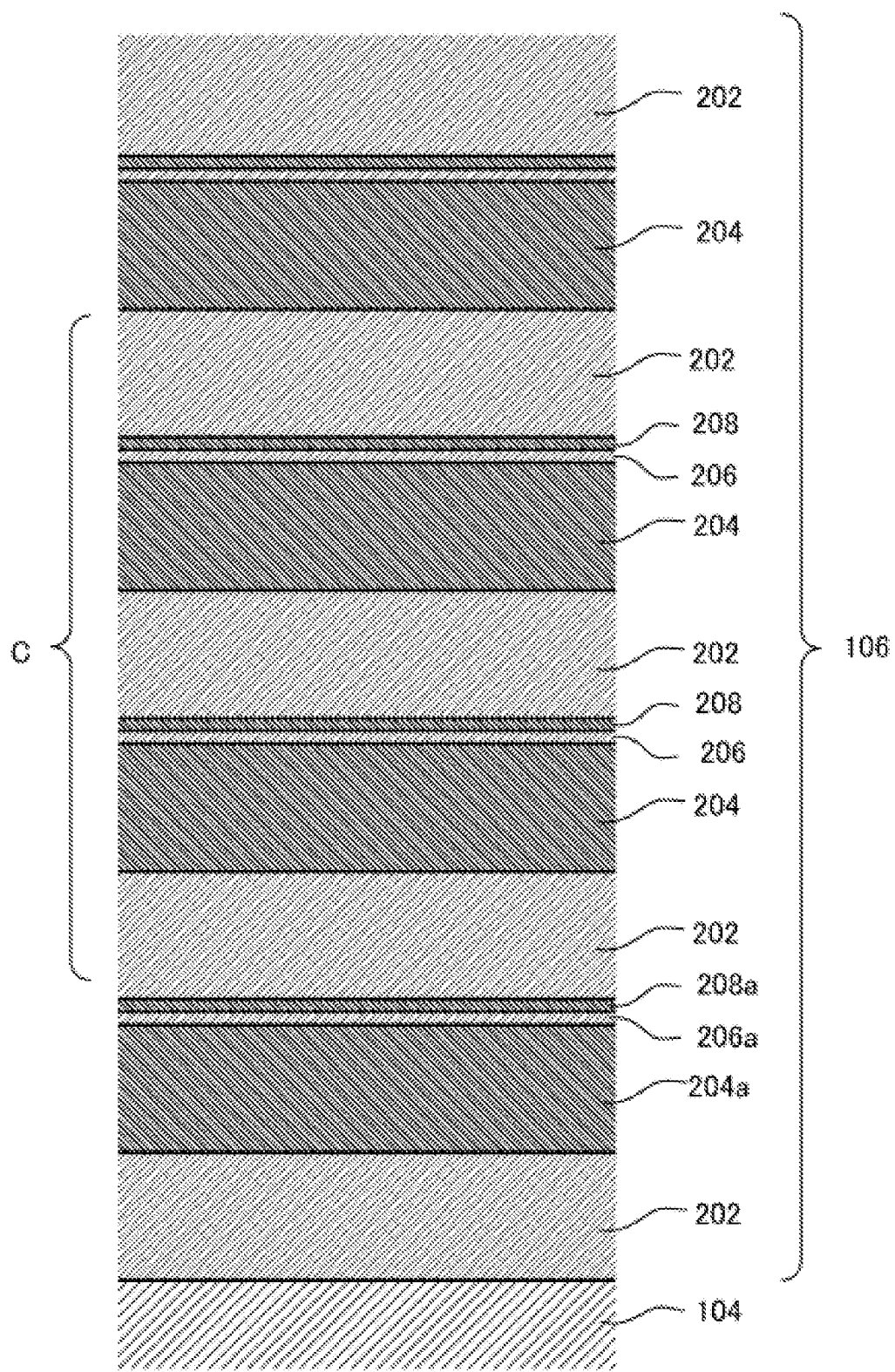
FIG. 2 is an enlarged cross-sectional view of region A in FIG. 1.
Figure 3:
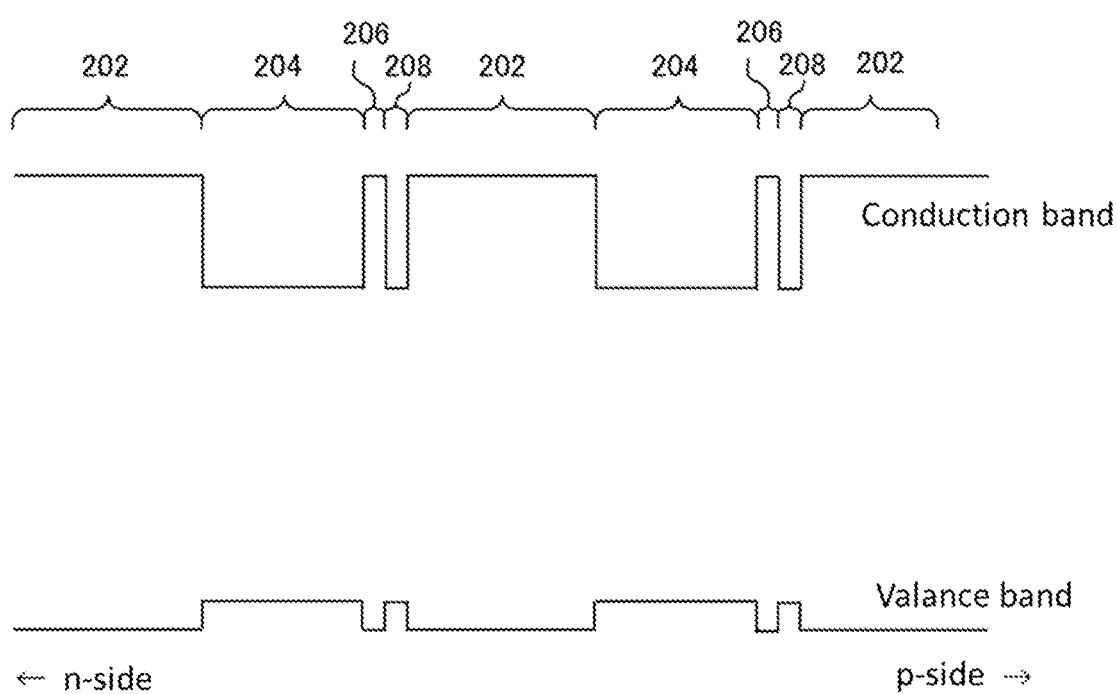
FIG. 3 is a schematic energy diagram showing the size of the band gap of each semiconductor layer in range C in FIG. 2.
Figure 4:
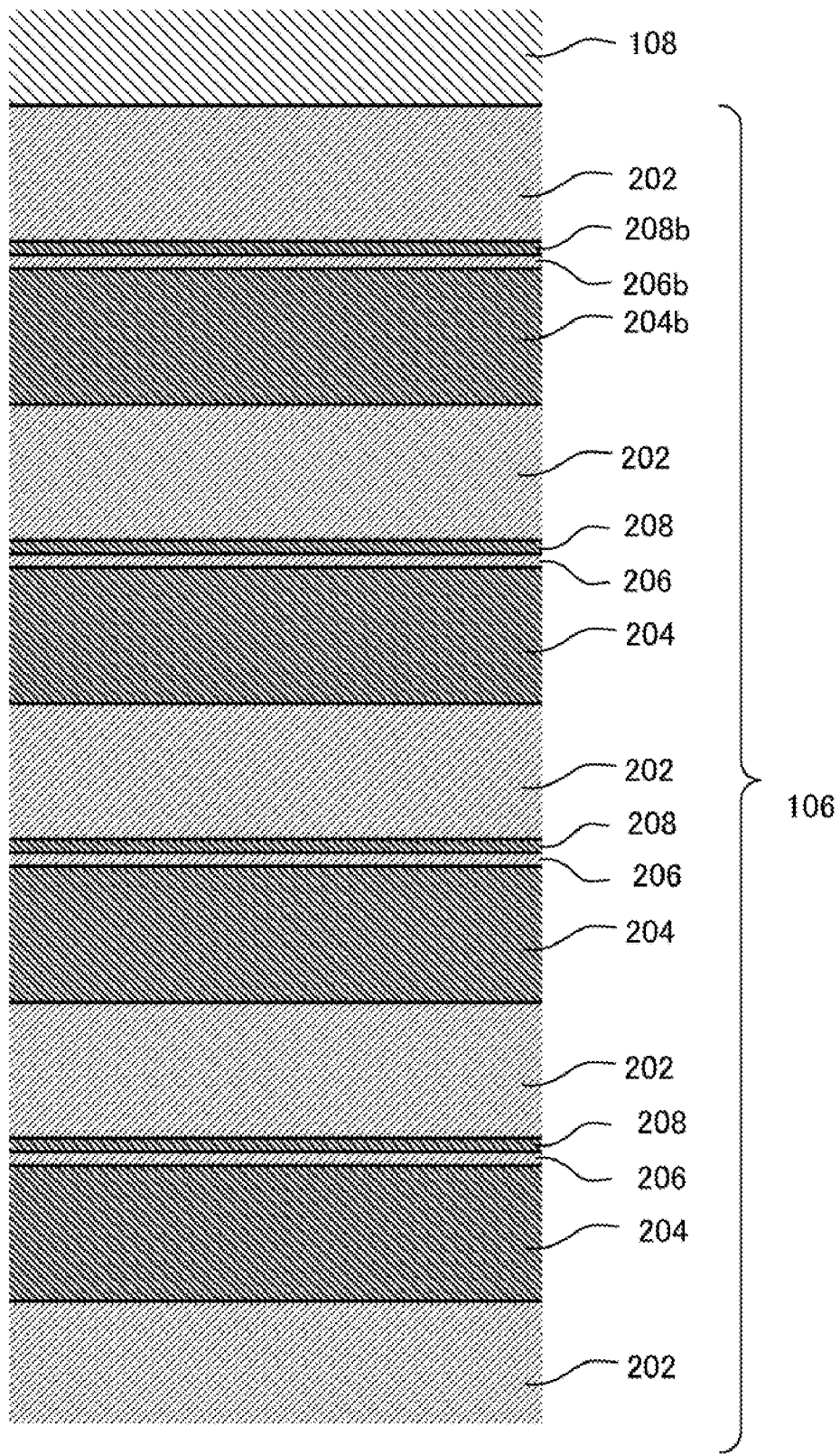
FIG. 4 is an enlarged cross-sectional view of region B in FIG. 1.

FIG. 1 is a schematic cross-sectional view of a light emitting element according to one embodiment of the present invention. FIG. 2 is an enlarged cross-sectional view of region A in FIG. 1. FIG. 3 is a schematic energy diagram showing the size of the band gap of each semiconductor layer in range C in FIG. 2. FIG. 4 is an enlarged cross-sectional view of region B in FIG. 1.

As shown in FIG. 1, the light emitting element 100 includes a substrate 102, an n-side semiconductor layer 104, an active layer 106, and a p-side semiconductor layer 108. For the substrate 102, for example, a sapphire ($Al_2O_3$) substrate, SiC substrate, GaN substrate or the like can be used.

The n-side semiconductor layer 104 is disposed on the substrate 102. The n-side semiconductor layer 104 is a nitride semiconductor. For the n-side semiconductor layer 104, for example, an n-type nitride semiconductor can be used. As one example, an Si-added GaN layer can be formed. A buffer layer may further be formed between the n-side semiconductor layer 104 and the substrate 102. For the buffer layer, a nitride semiconductor, such as GaN, AlGaN or the like, can be used. The active layer 106 is disposed on the n-side semiconductor layer 104. The p-side semiconductor layer 108 is disposed on the active layer 106. The p-side semiconductor layer 108 is a nitride semiconductor. For the p-side semiconductor layer 108, for example, a p-type nitride semiconductor can be used. As one example, an Mg-added GaN layer can be formed.

As shown in FIG. 2 and FIG. 4, the active layer 106 has a multi-quantum well structure in which a plurality of well layers 204 and a plurality of barrier layers 202 are alternately stacked. The well layers 204 and the barrier layers 202 are nitride semiconductors. The barrier layers 202 may be a nitride semiconductor containing Ga. For example, the barrier layers 202 may be GaN. The thickness of a barrier layer 202 may be in a range of 3.0 to 5.0 nm. The well layers 204 may be a nitride semiconductor containing In. For example, the well layers 204 may be InGaN. The thickness of a well layer 204 is preferably lower than the thickness of a barrier layer 202.

In this embodiment, a first layer 206 and a second layer 208 are disposed between each of the well layers 204 and the barrier layer 202 disposed adjacent thereto on the p-side semiconductor layer 108 side. That is, as shown in FIG. 2 and FIG. 4, the first layer 206 and the second layer 208 are disposed between each well layer 204 and the barrier layer 202 disposed thereon (on the p-side semiconductor layer 108 side). The first layer 206 and the second layer 208 are disposed successively from the well layer 204 side.

As shown in FIG. 2, for the sake of convenience, the well layer 204 closest to the n-side semiconductor layer 104 is denoted as "the first well layer 204a," and the first layer 206 and the second layer 208 disposed between the first well layer 204a and the barrier layer 202 disposed thereon are denoted as "the initial first layer 206a" and "the initial second layer 208a," respectively. As shown in FIG. 4, the well layer 204 closest to the p-side semiconductor layer 108 is denoted as "the last well layer 204b," and the first layer 206 and the second layer 208 disposed between the last well layer 204b and the barrier layer 202 disposed thereon are denoted as "the last first layer 206b" and "the last second layer 208b," respectively.

As shown in FIG. 3, the band gap of a first layer 206 is larger than that of any well layer 204. The band gap of a second layer 208 is smaller than that of any first layer 206 and any barrier layer 202. In this embodiment, the first layers 206 and the barrier layers 202 have the same band gap. Moreover, the second layers 208 and the well layers 204 have the same band gap.

The thickness of a first layer 206 is lower than the thickness of any well layer 204. The first layers 206 may be nitride semiconductors containing Ga. For example, the first layers 206 may be GaN. The thickness of a second layer 208 is lower than the thickness of any well layer 204. The second layers 208 are nitride semiconductors containing In. The second layers 208 may be InGaN. In the case of using InGaN for the second layers 208, the In mixed crystal composition ratio can be set to a range of from 3% to 50%, preferably from 5% to 30%, more preferably 10% to 20%.

On one part of the surface of the p-side semiconductor layer 108, a p-electrode 114 is disposed to be electrically connected to the p-side semiconductor layer 108. An n-electrode 112 is disposed on the surface of the n-side semiconductor layer 104 exposed by partially removing the p-side semiconductor layer 108 and the active layer 106 to be electrically connected to the n-side semiconductor layer 104.

In this embodiment, "a first layer 206 and a second layer 208 are disposed between each of the well layers 20 and the barrier layer 202 disposed adjacent thereto on the p-side semiconductor layer 108 side," but the present invention is not limited to such an embodiment. In another embodiment of the present invention, a first layer 206 and a second layer 208 may be disposed only between some of the well layers 204 and the barrier layers 202 respectively disposed adjacent thereto on the p-side semiconductor layer 108 side. For example, a first layer 206 and a second layer 208 may be disposed between only one of the well layers 204 and the barrier layer 202 disposed adjacent thereto on the p-side semiconductor layer 108 side.

More carriers are present in the region of a well layer 204 on the p-side semiconductor 108 side than on the n-side semiconductor 104 side. Accordingly, by disposing at this location a first layer 206 having a larger band gap and lower thickness than those of a well layer 204, and a second layer 208 having a smaller band gap than that of a barrier layer and a lower thickness than that of a well layer 204, electrons can be efficiently accumulated. This is believed to facilitate efficient recombination to increase the internal quantum efficiency to thereby increase the emission efficiency of the light emitting element 100 even when driven at higher currents that readily induce the droop phenomenon.

The thickness of a first layer 206 is preferably in a range of 0.3 to 2.0 nm. This is because an excessively thick first layer 206 reduces the internal quantum efficiency, which reduces the emission efficiency. The thickness of a second layer 208 is preferably in a range of 0.3 to 2.0 nm. This is because an excessively thick second layer 208 causes the layer to emit light, generating light of a wavelength other than that intended, which reduces the internal quantum efficiency. The In content of a second layer 208 is preferably lower than the In content of a well layer 204. This can make the band gap of the second layer 208 larger than that of the well layer 204 thereby restraining the emission in the second layer 208.

Each semiconductor layer in this embodiment can be formed by any known technique, such as metalorganic chemical vapor deposition (MOCVD), hydride vapor phase epitaxy (HVPE), molecular beam epitaxy (MBE), or the like. In the case of forming each semiconductor layer by MOCVD, trimethylgallium (TMG) or triethylgallium (TEG) can be used as the raw material for gallium, trimethylaluminum (TMA) can be used as the raw material for aluminum, trimethylindium (TMI) can be used as the raw material for indium, and $NH_3$ can be used as the raw material for nitrogen. In the case of adding Si as an n-type impurity, silane gas can be used as the raw material, and in the case of adding Mg as a p-type impurity, $Cp_2Mg$ (bis cyclopentadienyl magnesium), for example, can be used as the raw material.

The n-electrode 112 and the p-electrode 114 can be formed by a method such as vapor deposition or sputtering. Specifically, a resist mask having openings at the locations where the n-electrode 112 or/and the p-electrode 114 are to be formed is applied, and an electrode material layer that can become the n-electrode 112 or/and the p-electrode 114 is formed by vapor deposition, sputtering, or the like. Subsequently, by removing the resist mask and the electrode material layer formed on the resist mask by a lift-off technique, the n-electrode 112 or/and p-electrode 114 can be formed. For the material for the n-electrode 112 and p-electrode 114, a single metal, such as Ag, Al, Ni, Rh, Au, Cu, Ti, Pt, Pd, Mo, Cr, W or the like, or an alloy having these metals as main components can be used. For example, T1 and Au can be successively stacked to form an electrode material layer.

In the description herein, expressions such as "on/thereon" and "under/thereunder" that are used to indicate the directions or positions of constituent elements describe the relative directions or positions of the constituent elements in cross-sectional diagrams, and are not intended to indicate their absolute positions unless otherwise specifically noted.

Second Embodiment

Figure 5:
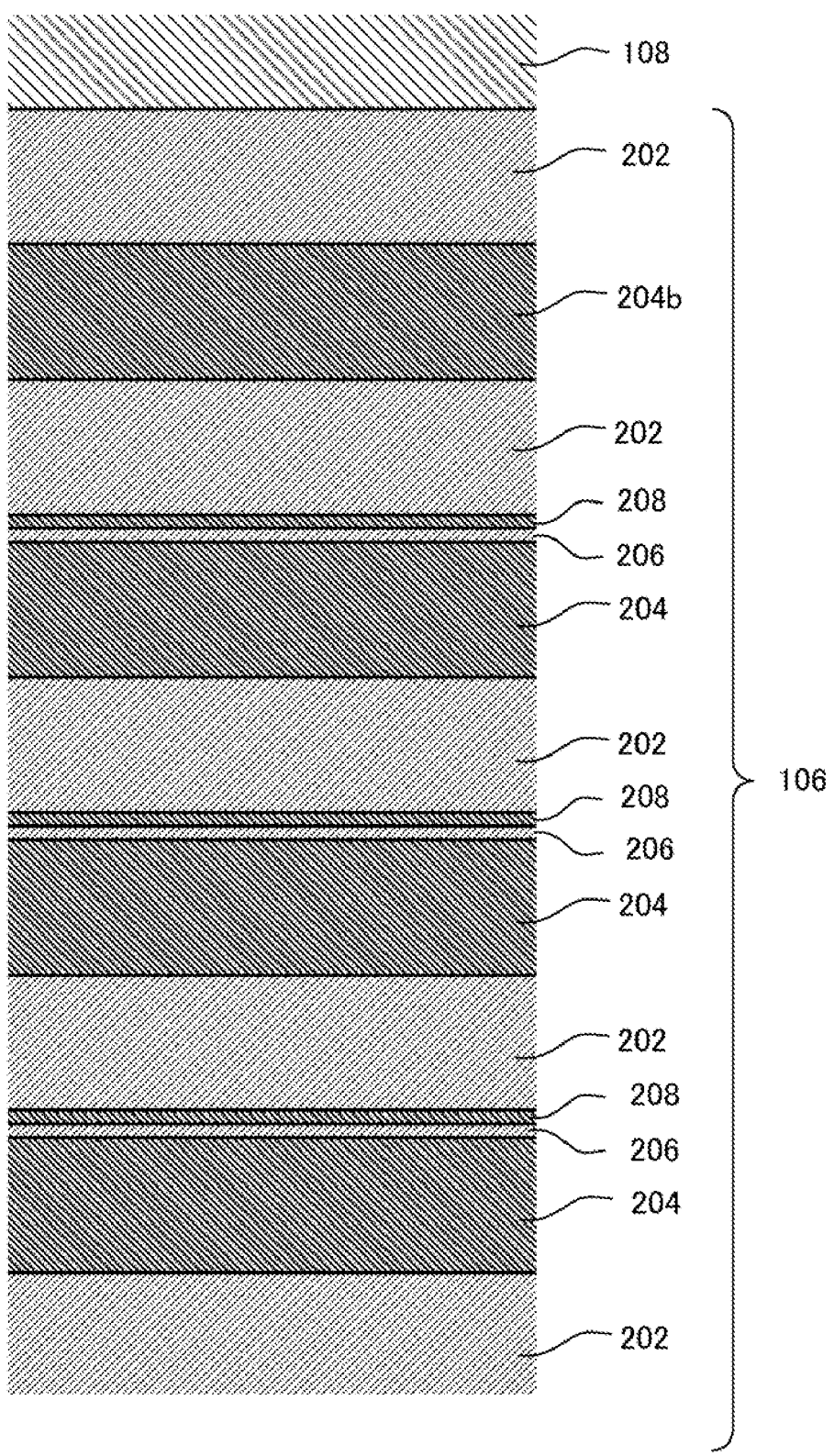
FIG. 5 is a schematic cross-sectional view of a light emitting element according to another embodiment.

FIG. 5 is a cross-sectional view schematically showing a light emitting element according to a second embodiment. This embodiment is a variation of the first embodiment. In this embodiment, the components, members, parts, or elements having the same functions as those in the first embodiment are denoted by the same reference numerals, and repeated explanations may be omitted.

This embodiment is configured such that the light emitting element has a first layer 206 and a second layer 208 disposed between each of the well layers 204, except for the last well layer 204b closest to the p-side semiconductor layer 108, and the barrier layer 202 disposed adjacent thereto on the p-side semiconductor layer 108 side. That is, as shown in FIG. 5, there is no last first layer 206b or last second layer 208b shown in FIG. 4 disposed between the last well layer 204b and the barrier layer 202 disposed thereon, but there are first layers 206 and second layers 208 disposed between the other well layers 204 and the barrier layers 202 respectively disposed thereon.

The light emitting element of this embodiment is different from the light emitting element 100 of the first embodiment (see FIG. 4) only with respect to the absence of the last first layer 206b and the last second layer 208b, and the remaining parts are the same as those of the light emitting element 100 of the first embodiment. If the last first layer 206b and the last second layer 208b are disposed between the last well layer 204b closest to the p-side semiconductor layer 108 and the barrier layer 202 disposed thereon, the presence of the last first layer 206b and the last second layer 208b might hinder the movement of electrons and holes. Accordingly, not disposing the last first layer 206b and the last second layer 208b can reduce the risk of hindering the movement of electrons and holes, thereby further improving the emission efficiency of the light emitting element.

Third Embodiment

Figure 6:
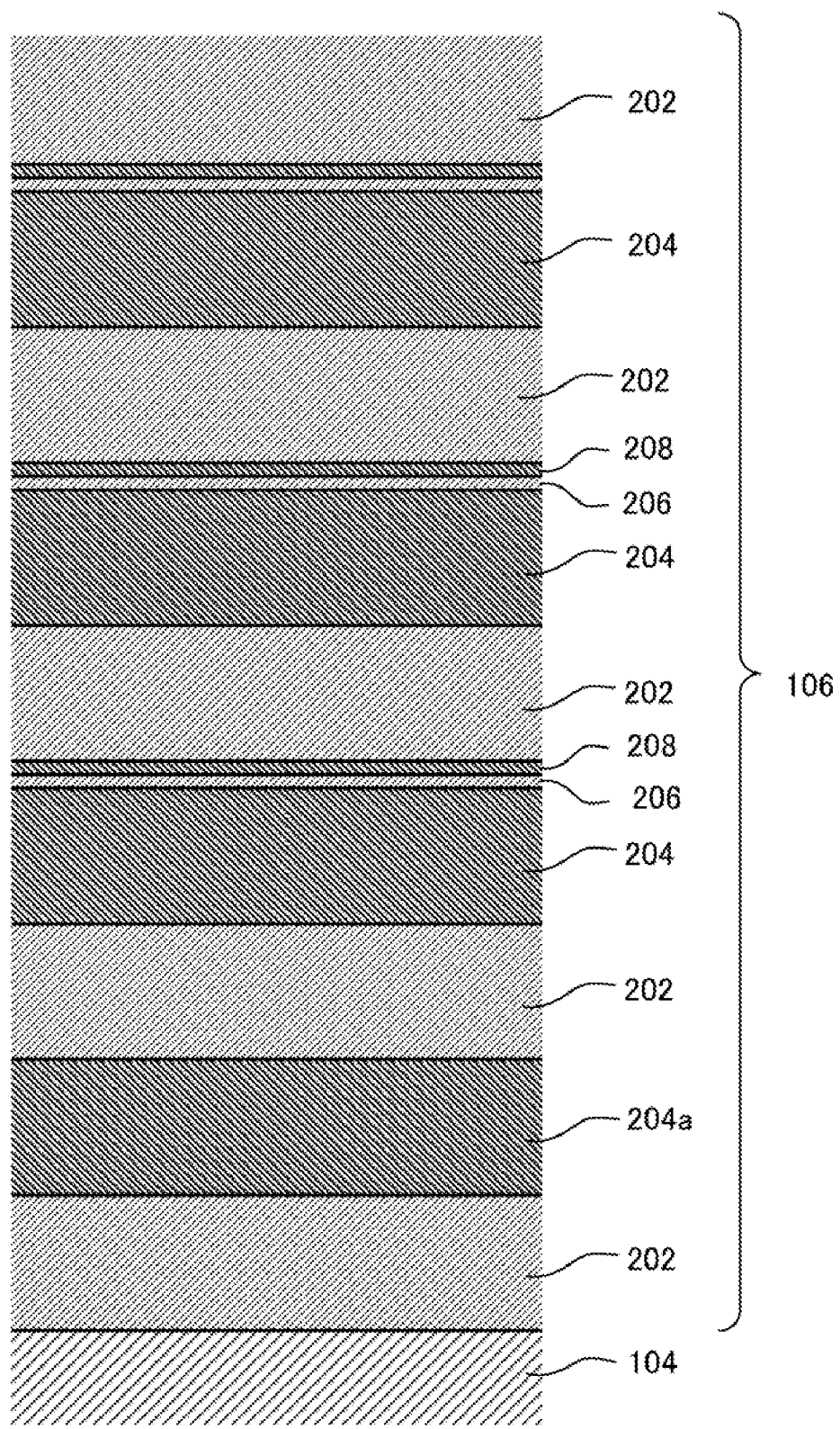
FIG. 6 is a schematic cross-sectional view of a light emitting element according to another embodiment.

FIG. 6 is a cross-sectional view schematically showing a light emitting element according to a third embodiment. This embodiment is a variation of the first embodiment. In this embodiment, the components, members, parts, or elements having the same functions as those in the first embodiment are denoted by the same reference numerals, and repeated explanations may be omitted.

This embodiment is configured such that the light emitting element has a first layer 206 and a second layer 208 disposed between each of the well layers 204, except for the first well layer 204a closest to the n-side semiconductor layer 104, and the barrier layer 202 disposed adjacent thereto on the p-side semiconductor layer 108 side. That is, as shown in FIG. 6, there is no initial first layer 206a or initial second layer 208a shown in FIG. 2 disposed between the first well layer 204a and the barrier layer 202 disposed thereon, but there are first layers 206 and second layers 208 disposed between the other well layers 204 and the barrier layers 202 respectively disposed thereon.

The light emitting element of this embodiment is different from the light emitting element 100 of the first embodiment only with respect to the absence of the initial first layer 206a and the initial second layer 208a, and the remaining parts are the same as those of the light emitting element 100 of the first embodiment. If the initial first layer 206a and the initial second layer 208a are disposed between the first well layer 204a closest to the n-side semiconductor layer 104 and the barrier layer 202 disposed thereon, the presence of the initial first layer 206a and the initial second layer 208a might hinder the movement of electrons and holes. Accordingly, not disposing the initial first layer 206a and the initial second layer 208a can reduce the risk of hindering the movement of electrons and holes, thereby further improving the emission efficiency of the light emitting element.

Fourth Embodiment

This embodiment is a variation of the first embodiment. In this embodiment, the components, members, parts, or elements having the same functions as those in the first embodiment are denoted by the same reference numerals, and repeated explanations may be omitted.

This embodiment is configured such that the light emitting element has a first layer 206 and a second layer 208 between each of the well layers 204, except for the first well layer 204a closest to the n-side semiconductor layer 104 and the last well layer 204b closest to the p-side semiconductor layer 108, and the barrier layer 202 disposed adjacent thereto on the p-side semiconductor layer 108 side.

To explain using FIG. 2 and FIG. 4 that show the first embodiment, this embodiment does not have the initial first layer 206a or the initial second layer 208a disposed between the first well layer 204a and the barrier layer 202 disposed thereon. Furthermore, it does not have the last first layer 206b or the last second layer 208b disposed between the last well layer 206b and the barrier layer 202 disposed thereon. First layers 206 and second layers 208 are disposed between the well layers 204, excluding the first well layer 204a and the last well layer 204b, and the barrier layers 202 respectively disposed thereon.

The light emitting element according to this embodiment is different from the light emitting element 100 of the first embodiment only with respect to the absence of the initial first layer 206a, the initial second layer 208a, the last first layer 206b, and the last second layer 208b, and the remaining parts are the same as those of the light emitting element 100 of the first embodiment. Disposing the initial first layer 206a, the initial second layer 208a, the last first layer 206b and the last second layer 208b might hinder the movement of electrons and holes. Accordingly, not disposing the initial first layer 206a, the initial second layer 208a, the last first layer 206b, and the last second layer 208b can reduce the risk of hindering the movement of electrons and holes, thereby further improving the emission efficiency of the light emitting element.

Fifth Embodiment

This embodiment is a variation of the first embodiment. In this embodiment, the components, members, parts, or elements having the same functions as those in the first embodiment are denoted by the same reference numerals, and repeated explanations may be omitted.

This embodiment is configured such that, with reference to FIG. 4, the In content of the last second layer 208b closest to the p-side semiconductor layer 108 is lower than the In contents of the other second layers 208. For example, in the case of composing the second layers 208 with InGaN and setting the mixed crystal composition ratio of In in the other second layers 208 as 15%, the mixed crystal composition ratio of In in the last second layer 208b is set to from 1% to 10%. As described earlier, if the last first layer 206b and the last second layer 208b are disposed between the last well layer 204b closest to the p-side semiconductor layer 108 and the barrier layer 202 disposed thereon, the presence of the last first layer 206b and the last second layer 208b might hinder the movement of electrons and holes. Reducing the In content of the last second layer 208b can make the band gap of the last second layer 208b larger than those of the other second layers 208. This reduces the rise of the last second layer 208b hindering the movement of electrons and holes, thereby increasing the emission efficiency of the light emitting element.

Sixth Embodiment

This embodiment is a variation of the first embodiment. In this embodiment, the components, members, parts, or elements having the same functions as those in the first embodiment are denoted by the same reference numerals, and repeated explanations may be omitted.

This embodiment is configured such that, with reference to FIG. 2, the In content of the initial second layer 208a closest to the n-side semiconductor layer 104 is lower than the In contents of the other second layers 208. For example, in the case of composing the second layers 208 with InGaN and setting the mixed crystal composition ratio of In in the other second layers 208 as 15%, the mixed crystal composition ratio of In in the initial second layer 208a is set to from 1% to 10%. As described earlier, if the initial first layer 206a and the initial second layer 208a are disposed between the first well layer 204a closest to the n-side semiconductor layer 104 and the barrier layer 202 disposed thereon, the presence of the initial first layer 206a and the initial second layer 208a might hinder the movement of electrons and holes. Reducing the In content of the initial second layer 208a can make the band gap of the initial second layer 208a larger than those of the other second layers 208. This reduces the risk of the initial second layer 208a hindering the movement of electrons and holes, thereby increasing the emission efficiency of the light emitting element.

Seventh Embodiment

This embodiment is a variation of the first embodiment. In this embodiment, the components, members, parts, or elements having the same functions as those in the first embodiment are denoted by the same reference numerals, and repeated explanations may be omitted.

This embodiment is configured such that, with reference to FIGS. 2 and 4, the In contents of the initial second layer 208a closest to the n-side semiconductor layer 104 and the last second layer 208b closest to the p-side semiconductor layer 108 are lower than the In contents of the other second layers 208. For example, in the case of composing the second layers 208 with InGaN and setting the mixed crystal composition ratio of In in the other second layers 208 as 15%, the mixed crystal composition ratio of In in the initial second layer 208a and the last second layer 208b is set to from 1% to 10%. As described earlier, disposing the initial first layer 206a, the initial second layer 208a, the last first layer 206b and the last second layer 208b might hinder movement of electrons and holes. Reducing the In contents of the initial second layer 208a and the last second layer 208b can make the band gaps of the initial second layer 208a and the last second layer 208b larger than those of the other second layers 208. This reduces the risk of the initial second layer 208a and the last second layer 208b hindering the movement of electrons and holes, thereby increasing the emission efficiency of the light emitting element.

Example 1

A light emitting element 100 was produced as described below.

For the substrate 102, a sapphire (C-plane) was used. In a MOCVD reactor, the surface of the substrate 102 was cleaned in a hydrogen ambiance at 1050° C. The temperature was then reduced to 550° C. and an AlGaN buffer layer was grown on the substrate to a thickness of about 12 nm by using TMA, TMG, and $NH_3$ as source gases. Then an n-side semiconductor layer 104 made of n-type GaN doped with Si at $1\times10^{19}/cm^3$ was grown at 1150° C. to a thickness of 6 μm by using TMG, TMA, ammonia, and monosilane.

The temperature was then reduced to 840° C. to allow a total of nine sets of layers, each having a GaN barrier layer 202 having a thickness of Tb (3.0 to 5.0 nm) formed by using TEG, TMI, and ammonia as source gasses, an $In_{0.15}Ga_{0.85}N$ well layer 204 having a thickness of Tw, a GaN first layer 206 having a thickness of T1, and an $In_{0.10}Ga_{0.90}N$ second layer 208 having a thickness of T2, stacked in that order, to grow. Then by growing a GaN barrier layer 202 to a thickness of 4 nm, the active layer 106 was formed.

Then using TMG, ammonia, and $Cp_2Mg$, a p-side semiconductor layer 108 made of GaN doped with Mg at $5\times10^{20}/cm^3$ was grown to a thickness of 23 nm. After the layer was grown, the wafer was placed in a reactor and annealed in a hydrogen ambiance at 700° C. to reduce the resistance of the p-side semiconductor layer 108.

After annealing, the surface (the electrode forming face) for forming an n-electrode 112 was exposed by removing the p-side semiconductor layer 108 and the active layer 106 in a region. Finally, a p-electrode 114 and an n-electrode 112 are formed on the surface of the p-side semiconductor layer 108 and the electrode forming face, respectively.

The output of the light emitting element 100 of Example 1 was measured by driving it at forward currents $I_f$ of 32.5 mA and 120 mA. The output was measured by placing the light emitting element in an integrating sphere and driving it at a prescribed current. The output in the central region of the substrate was measured.

Figure 7:
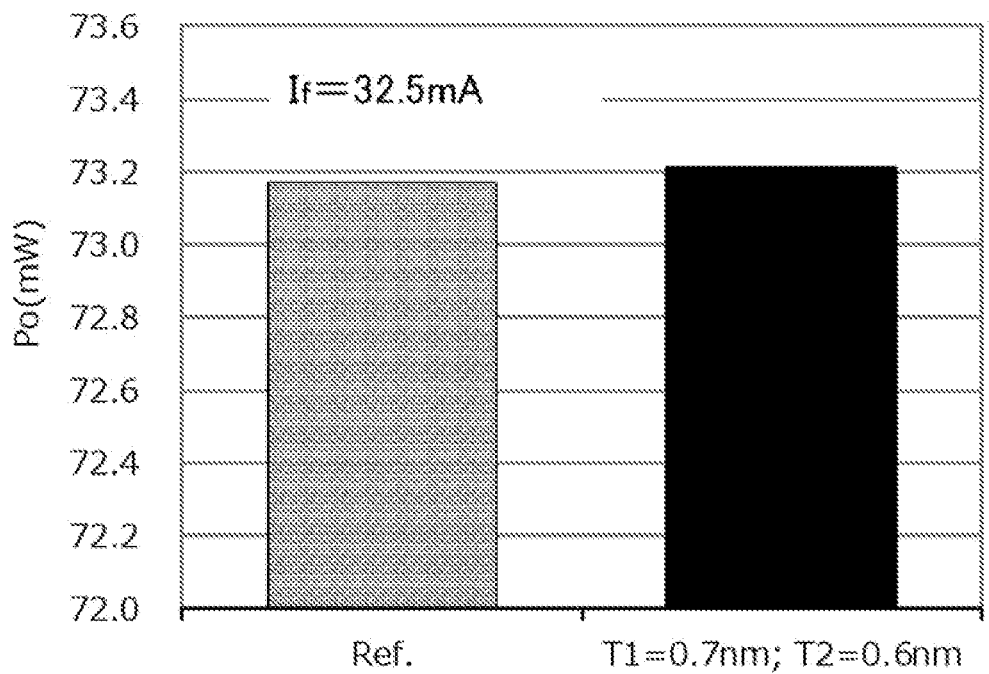
FIG. 7 shows the results of measuring the output of the light emitting element of Example 1 when a drive current of 32.5 mA was applied.

FIG. 7 shows the results of measuring the outputs of the light emitting element of Example 1 and the reference sample of the light emitting element described later when driven at a forward current $I_f$ of 32.5 mA. The vertical axis of the graph in FIG. 7 represents the outputs Po of the light emitting elements.

In FIG. 7, the sample labeled "T1=0.7 nm, T2=0.6 nm" was produced by the method described above, and in this light emitting element 100, the thickness T1 of a first layer 206 was 0.7 nm and the thickness T2 of a second layer 208 was 0.6 nm. In the light emitting element 100, moreover, the thickness Tb of a barrier layer 202 was 4.3 nm and the thickness Tw of a well layer 204 was 3.2 nm.

In FIG. 7, the sample labeled "Ref" is a reference sample that has a similar structure to that of the light emitting element 100 of Example 1 except for not including first layers 206 and the second layers 208.

As is understood from the results shown in FIG. 7, in the case where the forward current $I_f$ was 32.5 mA, the light emitting element 100 of Example 1 had a similar output to that of the reference sample.

Figure 8:
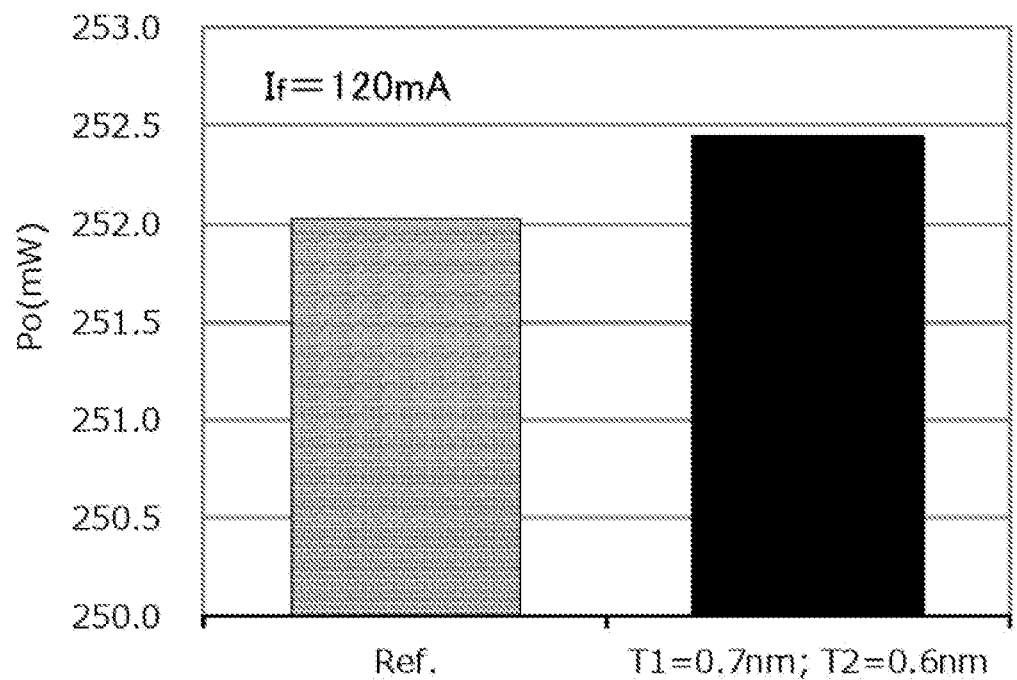
FIG. 8 shows the results of measuring the output of the light emitting element of Example 1 when a drive current of 120 mA was applied.

FIG. 8 shows the results of measuring the outputs of the light emitting element 100 of Example 1 and the reference sample when driven at a forward current $I_f$ of 120 mA. FIG. 8 shows the results obtained by changing the forward current $I_f$ to 120 mA applied to the same light emitting elements used in the measurements shown in FIG. 7. As is understood from the results shown in FIG. 8, when driven at a higher current, the output of the light emitting element 100 of Example 1 was higher than the output of the reference sample. This is believed to be because the first layers 206 and second layers 208 provided on the well layers 204 on the p-side semiconductor layer 108 side in the light emitting element 100 can efficiently accumulate electrons, facilitating efficient recombination to increase the internal quantum efficiency even when the light emitting element 100 is driven at a higher current, thereby increasing the emission efficiency of the light emitting element.

Example 2

A light emitting element 100 of Example 2 in which the thickness Tb of a barrier layer 202 was 4.0 nm, the thickness Tw of a well layer 204 was 3.0 nm, and the thickness T1 of a first layer 206 and the thickness T2 of a second layer 208 were 0.5 nm, was produced using the same method as that describe with reference to Example 1.

Figure 9:
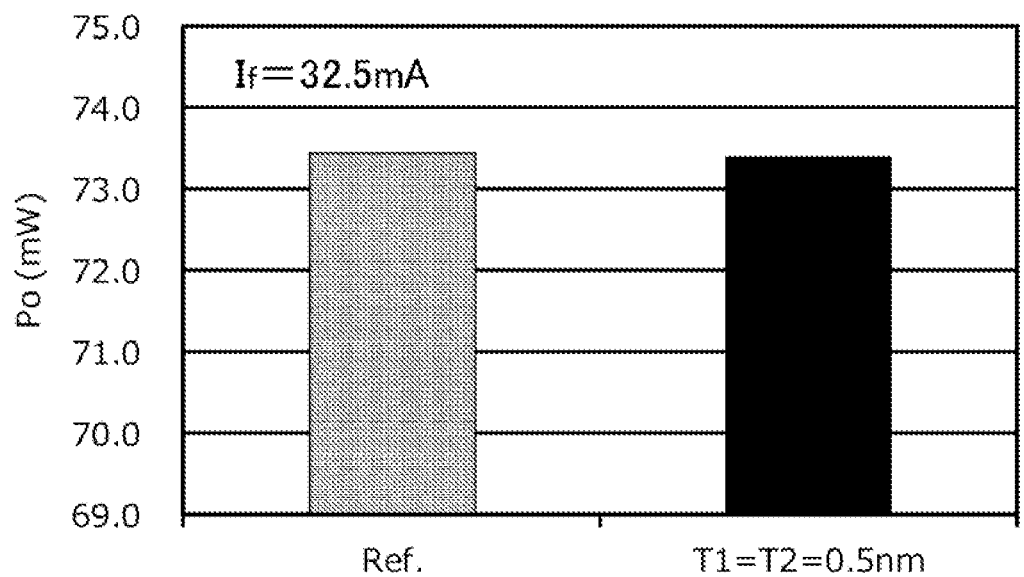
FIG. 9 shows the results of measuring the output of the light emitting element of Example 2 when a drive current of 32.5 mA was applied.

FIG. 9 shows the results of measuring the output of the light emitting element 100 of Example 2 when driven at a forward current of 32.5 mA. In FIG. 9, "T1=T2=0.5 nm" indicates that the thickness T1 of a first layer 206 and the thickness T2 of a second layer 208 are 0.5 nm. The other labels in FIG. 9 have the same meaning as those in FIG. 7. The reference sample used for this example had the same structure as the reference sample used in Example 1 except for having different thicknesses of the barrier layers 202 and well layers 204. The thickness of a barrier layer 202 and the thickness of a well layer 204 of the reference sample used for this example were 4.0 nm and 3.0 nm, respectively.

According to the results shown in FIG. 9, the output of the light emitting element 100 of Example 2 in which the thickness Tb of a barrier wall 202 is 4.0 nm was similar to the output of the reference sample when the forward current $I_f$ was 32.5 mA.

Figure 10:
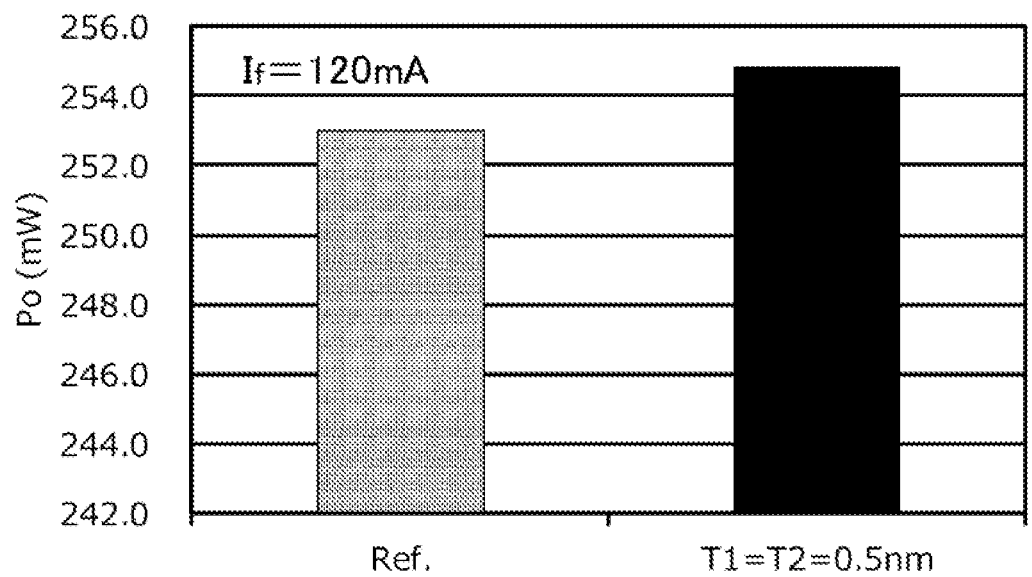
FIG. 10 shows the results of measuring the output of the light emitting element of Example 2 when a drive current of 120 mA was applied.

FIG. 10 shows the results of measuring the output of the light emitting element 100 of Example 2 when driven at a forward current of 120 mA. FIG. 10 shows the results obtained by changing the forward current $I_f$ to 120 mA applied to the same light emitting elements used in the measurements shown in FIG. 9. As is understood from the results shown in FIG. 10, when driven at a higher current, the output of the light emitting element 100 in which Tb is 4.0 nm was higher than that of the reference sample. The results show the same tendency as that in the light emitting element 100 of Example 1 shown in FIG. 8. That is, the emission efficiency of the light emitting element 100 can be increased even when driven at a higher current by disposing the first layers 206 and the second layers 208 that promote efficient recombination. Moreover, the thickness of a well layer 204 is preferably lower than that of a barrier layer 202.

Example 3

A light emitting element 100 of Example 3 in which the thickness T1 of a first layer 206 and the thickness T2 of a second layer 208 were 0.3 nm was produced using the same method as that described with reference to Example 1. The thickness Tb of a barrier layer 202 in the light emitting element 100 of Example 3 was 4.3 nm, and the thickness Tw of a well layer 204 was 3.2 nm.

In order to investigate the effect of the positions of the first layers 206 and the second layers 208, a light emitting element was prepared in which a first layer 206 and a second layer 208 were also disposed between each of the well layers 204 and the barrier layer 202 disposed adjacent thereto on the n-side semiconductor layer 104 side. That is, to explain using FIG. 2, this sample had a first layer 206 and a second layer 208 disposed between each well layer 204 and the barrier layer 202 disposed thereunder (on the n-side semiconductor layer 104 side). The first layer 206 and the second layer 208 are disposed successively from the well layer 204 side. This sample is hereinafter referred to as the "comparative sample."

Figure 11:
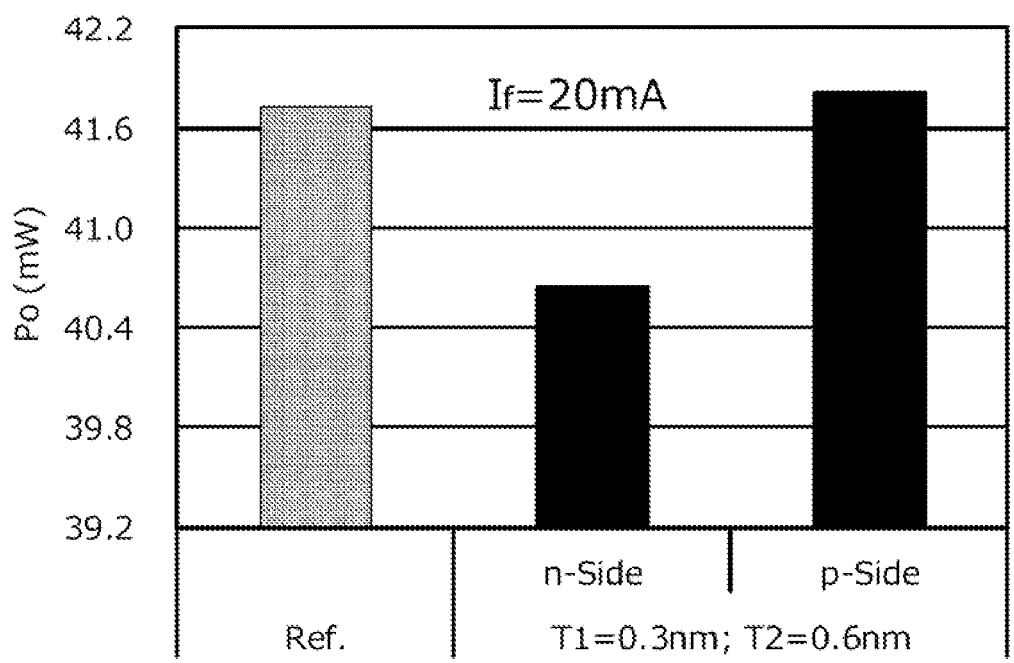
FIG. 11 shows the results of measuring the effect of the positions of the first layer and the second layer on the output of a light emitting element.

FIG. 11 shows the results of measuring the effect of the positions of the first layers 206 and the second layers 208 on the output of the light emitting elements. In FIG. 11, "T1=0.3 nm, T2=0.6 nm" indicates that the thickness T1 of a first layer 206 is 0.3 nm, and the thickness T2 of a second layer 208 is 0.6 nm. In FIG. 11, "p-Side" represents the light emitting element 100 of Example 3, and "n-Side" represents the comparative sample. The remaining labels in FIG. 11 mean the same as those in FIG. 7. The reference sample used for this example has the same structure as that of the reference sample used for Example 1.

FIG. 11 shows the output measurements obtained when driving the light emitting element of Example 3, the comparative sample, and the reference sample at a forward current of 20 mA. The results show that the light emitting element 100 of Example 3 (the p-Side) had a similar output to that of the reference sample, and the output of the comparative sample (the n-Side) was lower than the other two.

Figure 12:
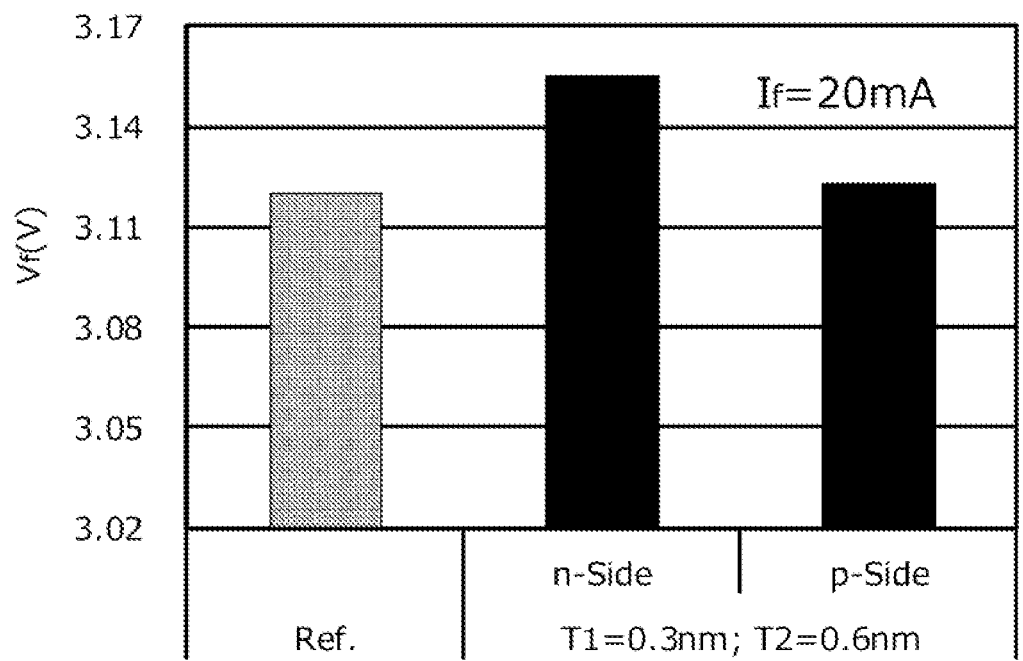
FIG. 12 shows the results of measuring the effect of the positions of the first layer and the second layer on the drive voltage for a light emitting element.

FIG. 12 shows the results of measuring the effect of the positions of the first layers 206 and the second layers 208 on the drive voltage for the light emitting elements. The vertical axis in FIG. 12 represents drive voltage $V_f$. That is, FIG. 12 shows the results of measuring the drive voltage $V_f$ when driving the light emitting element of Example 3, the comparative sample, and the reference sample at a forward current of 20 mA. The other labels in FIG. 12 mean the same as those in FIG. 11.

According to the results shown in FIG. 12, the light emitting element 100 of Example 3 and the reference sample showed a similar drive voltage, but the comparative sample showed a higher drive voltage than the other two. This indicates that a higher drive voltage is required to drive the comparative sample than that to drive the light emitting element 100 and the reference sample. Considering this in combination with the results shown in FIG. 11, the comparative sample has a higher drive voltage requirement and a lower output than the light emitting element 100 of Example 3 and the reference sample. That is, the comparative light emitting element has extremely low emission efficiency. This is believed to be attributable to scarce carriers on the face of a well layer 204 on the n-side semiconductor layer 104 side, and even if the first layer 206 and the second layer 208 are disposed there, they do not function as layers for accumulating electrons, but rather generate an unnecessary internal electric field. This is believed to consequently hinder recombination to thereby reduce the internal quantum efficiency. Moreover, because the light emitting element of Example 3 has a similar structure to that of Example 1, it can increase the emission efficiency even when driven at a higher current.

The measurement results of the examples described above revealed that disposing a first layer 206 and a second layer 208 between a well layer 204 and the barrier layer 202 disposed adjacent thereto on the p-side semiconductor layer 108 side can increase the emission efficiency of the light emitting element 100 when driven at a higher current.

Although the present invention has been explained in the foregoing with reference to certain embodiments and examples, the technical scope of the present invention is not limited to the scope of the embodiments and examples. A person having ordinary skill in the art can evidently make various modifications and improvements to the embodiments described above. It is clear from the scope of the claims that such modifications and improvements will also be encompassed by the technical scope of the present invention. For example, although the embodiments have been explained in detail above for the purpose of making the present invention easily understood, the present invention is not necessarily limited to one having all of the elements described. Moreover, some of the elements in each embodiment described can be replaced with other elements or removed.

What is claimed is:

1. A light emitting element comprising:
an n-side semiconductor layer made of a nitride semiconductor;
a p-side semiconductor layer made of a nitride semiconductor; and
an active layer disposed between the n-side semiconductor and the p-side semiconductor layer and having a multi-quantum well structure in which a plurality of well layers made of a nitride semiconductor and a plurality of barrier layers made of a nitride semiconductor are alternately stacked,
wherein the plurality of well layers includes a first well layer disposed closest to the n-side semiconductor layer, a last well layer disposed closest to the p-side semiconductor layer, and an intermediate well layer disposed between the first well layer and the last well layer,
wherein the plurality of barrier layers includes a first barrier layer disposed adjacent to the first well layer on a p-side semiconductor side of the first well layer, a last barrier layer disposed adjacent to the last well layer on a p-side semiconductor side of the last well layer, and an intermediate barrier layer disposed adjacent to the intermediate well layer on a p-side semiconductor side of the intermediate well layer,
wherein a band gap of each of the barrier layers is greater than a band gap of each of the well layers, and
wherein the active layer comprises, between the intermediate well layer and the intermediate barrier layer:
a first layer and a second layer disposed successively in a direction from the intermediate well layer to the intermediate barrier layer,
wherein a band gap of the first layer is larger than a band gap of the intermediate well layer,
wherein a thickness of the first layer is lower than a thickness of the intermediate well layer,
wherein a band gap of the second layer is smaller than the band gap of the first layer, smaller than a band gap of the intermediate barrier layer, and equal to the band gap of the intermediate well layer,
wherein a thickness of the second layer is lower than the thickness of the intermediate well layer, and
wherein no first and second layers are disposed between the last well layer and the last barrier layer.

2. The light emitting element according to claim 1, wherein the well layers and the second layer are made of a nitride semiconductor containing In, and wherein an In content of the second layer is lower than an In content of the intermediate well layer.

3. The light emitting element according to claim 1, wherein the thickness of the first layer is in a range of 0.3 to 2.0 nm.

4. The light emitting element according to claim 1, wherein the thickness of the second layer is in a range of 0.3 to 2.0 nm.

5. The light emitting element according to claim 1, wherein no first and second layers are disposed between the first well layer and the first barrier layer.

6. The light emitting element according to claim 2, wherein no first and second layers are disposed between the first well layer and the first barrier layer.

7. The light emitting element according to claim 1, wherein an In content of an initial second layer closest to the n-side semiconductor layer is lower than an In content of each and every other second layer.

8. The light emitting element according to claim 2, wherein an In content of an initial second layer closest to the n-side semiconductor layer is lower than an In content of each and every other second layer.

9. The light emitting element according to claim 1, wherein the barrier layers and the first layer are made of a nitride semiconductor containing Ga.

10. The light emitting element according to claim 1, wherein a thickness of each barrier layer is in a range of 3.0 to 5.0 nm.

11. The light emitting element according to claim 1, wherein a thickness of each well layer is lower than a thickness of each barrier layer.

12. The light emitting element according to claim 1, wherein the thickness of the first layer is the same as the thickness of the second layer.

13. The light emitting element according to claim 1, wherein the thickness of the first layer is lower than a thickness of the intermediate barrier layer.

14. The light emitting element according to claim 1, wherein the thickness of the first layer is lower than a thickness of each of the barrier layers.

15. The light emitting element according to claim 1, wherein the band gap of the first layer is equal to the band gap of the intermediate barrier layer.

16. The light emitting element according to claim 1, wherein the band gap of the first layer is equal to the band gap of each of the barrier layers.

17. The light emitting element according to claim 1, wherein the well layers and the second layer are made of a nitride semiconductor containing In, and wherein an In content of the second layer is lower than an In content of each of the well layers.

18. The light emitting element according to claim 1, wherein the second layer is made of a nitride semiconductor containing In, and wherein an In mixed crystal composition ratio is between 10% to 20%.

* * * * *